United States Patent
Kajihara (10) Patent No.: US 9,450,564 B2
(45) Date of Patent: Sep. 20, 2016

(54) ELASTIC WAVE FILTER

(71) Applicant: NIHON DEMPA KOGYO CO., LTD., Tokyo (JP)

(72) Inventor: Ryuji Kajihara, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 113 days.

(21) Appl. No.: 14/470,933

(22) Filed: Aug. 27, 2014

(65) Prior Publication Data

US 2015/0070108 A1 Mar. 12, 2015

(30) Foreign Application Priority Data

Sep. 12, 2013 (JP) .................................. 2013-189452

(51) Int. Cl.
*H03H 9/64* (2006.01)
*H03H 9/145* (2006.01)

(52) U.S. Cl.
CPC ......... *H03H 9/6489* (2013.01); *H03H 9/1452* (2013.01); *H03H 9/14517* (2013.01)

(58) Field of Classification Search
CPC ............. H03H 9/6489; H03H 9/6493; H03H 9/14517; H03H 9/1452
USPC ...................................... 333/196; 310/313 C
See application file for complete search history.

(56) References Cited

U.S. PATENT DOCUMENTS 5,561,408 A * 10/1996 Yamamoto ........... H03H 9/6489
310/313 C

FOREIGN PATENT DOCUMENTS

| JP | 06-334469   | 12/1994 |
|----|-------------|---------|
| JP | 2000-286664 | 10/2000 |
| JP | 2004-260543 | 9/2004  |
| JP | 2011-160488 | 8/2011  |

* cited by examiner

*Primary Examiner* — Benny Lee
*Assistant Examiner* — Jorge Salazar, Jr.
(74) *Attorney, Agent, or Firm* — Jianq Chyun IP Office (57) ABSTRACT

An elastic wave filter includes a piezoelectric substrate, an input side IDT electrode, an output side IDT electrode, and a reflector. At least one IDT electrode among the input side IDT electrode and the output side IDT electrode is weighted only with a main lobe among an apodized weighting method such that the intersection length becomes short from a part at which one electrode finger is opposed to another electrode finger adjacent to the one electrode finger toward an end portion of the at least one IDT electrode in a propagation direction of an elastic wave. A part with the largest intersection length in the at least one IDT electrode is shifted to any one of one side and another side in the propagation direction of the elastic wave from a center position at the at least one IDT electrode in the propagation direction of the elastic wave.

2 Claims, 11 Drawing Sheets

ELASTIC WAVE FILTER

CROSS-REFERENCE TO RELATED APPLICATIONS

This application claims the priority benefit of Japanese application serial no. 2013-189452, filed on Sep. 12, 2013. The entirety of the above-mentioned patent application is hereby incorporated by reference herein and made a part of this specification.

TECHNICAL FIELD

This disclosure relates to a resonant Surface Acoustic Wave (SAW) filter using a longitudinal mode.

DESCRIPTION OF THE RELATED ART

As a SAW filter using an elastic wave (surface acoustic wave), for example, there is known a configuration where an interdigital transducer (IDT) electrode is disposed on a piezoelectric substrate such as a crystal. One specific example of such filter includes a transversal filter and a resonant filter. The transversal filter includes the IDT electrodes as an input side electrode and an output side electrode arranged so as to be separated from one another in a propagation direction of the elastic wave. The resonant filter includes a pair of reflectors so as to sandwich a configuration formed of these input side electrode and output side electrode.

Japanese Unexamined Patent Application Publication No. 2011-160488 (Patent Literature 1) discloses the following technique. In the above-described resonant filter, two resonators are connected in parallel to one another. Apodized weighting is performed on electrode fingers of the respective resonators. Then, to reduce a spurious in a transverse mode, intersection lengths of the electrode fingers in these resonators are set to dimensions different from one another. However, in the case where this technique is applied to a so-called band path filter that includes stopbands at the low-pass side and the high-pass side with respect to a passband, a spurious may remain at the stopband at the high-pass side with respect to the passband.

Japanese Unexamined Patent Application Publication No. 2000-286664 (hereinafter referred to as Patent Literature 2) and Japanese Unexamined Patent Application Publication No. 2004-260543 (hereinafter referred to as Patent Literature 3) disclose the following technique. Apodized weighting is performed on electrode fingers of a transversal filter. Alternatively, when the apodized weighting is performed on an IDT electrode, a peak of a main lobe is shifted from the center position of the IDT electrode. However, Patent Literatures 2 and 3 do not examine a spurious that occurs at a high-pass side with respect to a passband when the resonant filter or the resonant filter as a band path filter is used.

A need thus exists for an elastic wave filter which is not susceptible to the drawbacks mentioned above.

SUMMARY

An elastic wave filter according to the disclosure includes a piezoelectric substrate, an input side IDT electrode, an output side IDT electrode, and a reflector. The input side IDT electrode includes a pair of busbars and an electrode finger. The pair of busbars are arranged so as to be separated from one another in a direction perpendicular to a propagation direction of an elastic wave on the piezoelectric substrate. The electrode finger each extend from each of the pair of busbars toward an opposed busbar in a comb shape. The output side IDT electrode includes a pair of busbars and an electrode finger. The pair of busbars are disposed at positions separating in the propagation direction of the elastic wave with respect to the input side IDT electrode. The pair of busbars are arranged so as to be separated from one another in the direction perpendicular to the propagation direction of the elastic wave on the piezoelectric substrate. The electrode finger each extending from each of the pair of busbars toward an opposed busbar in a comb shape. The reflector includes a pair of reflector busbars and a reflector electrode finger. When viewed from a line arrangement of the input side IDT electrode and the output side IDT electrode, the respective pair of reflector busbars being arranged at one side and another side in the propagation direction of the elastic wave. The pair of reflector busbars is disposed so as to be separated from one another in the direction perpendicular to the propagation direction of the elastic wave. The reflector electrode finger connects between the reflector busbars. Assuming that a length dimension at which the electrode fingers adjacent to one another intersect is referred to as an intersection length, at least one IDT electrode among the input side IDT electrode and the output side IDT electrode is weighted only with a main lobe among an apodized weighting method such that the intersection length becomes short from a part at which one electrode finger is opposed to another electrode finger adjacent to the one electrode finger toward an end portion of the at least one IDT electrode in a propagation direction of an elastic wave. A part with the largest intersection length in the at least one IDT electrode is shifted to any one of one side and another side in the propagation direction of the elastic wave from a center position at the at least one IDT electrode in the propagation direction of the elastic wave.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Figure 1:
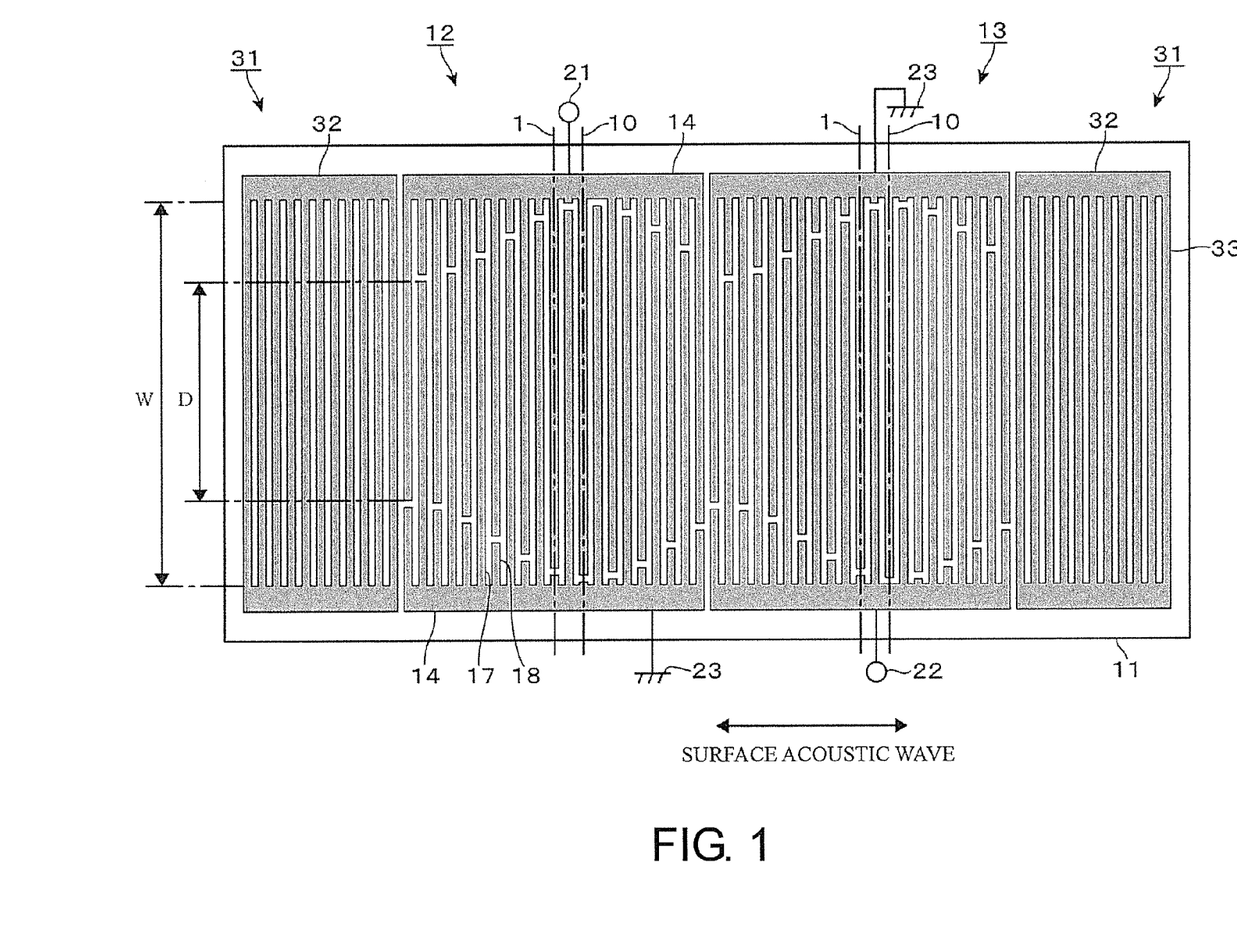
FIG. 1 is a plan view illustrating an exemplary elastic wave filter according to an embodiment of this disclosure.

The following description describes an elastic wave filter according to the embodiment of this disclosure with reference to FIG. 1. This elastic wave filter includes an input side IDT electrode 12 and an output side IDT electrode 13. The input side IDT electrode 12 and the output side IDT electrode 13 are arranged on a piezoelectric substrate 11, such as a crystal separated from one another in a propagation direction of an elastic wave. In this example, the input side IDT electrode 12 and the output side IDT electrode 13 are disposed at a left side and a right side in FIG. 1, respectively. With respect to the arrangement of these IDT electrodes 12 and 13, reflectors 31 and 31 are disposed at regions shifted to one side (right side) and the other side (left side) in the propagation direction of the elastic wave, respectively. Reference numerals 21 and 22 in FIG. 1 denote an input port and an output port forming signal ports, respectively, and reference numeral 23 denotes a grounding port. The following description describes specific configurations of the respective IDT electrodes 12 and 13 and reflector 31.

The input side IDT electrode 12 includes a pair of busbars 14 and 14. The busbars 14 and 14 each extends along the propagation direction of the elastic wave. The busbars 14 and 14 are formed so as to be in parallel, separating from one another in a direction perpendicular to the propagation direction. These busbars 14 and 14 each includes a plurality of electrode fingers 17 extending toward the opposed busbars 14 and 14. In the pair of of busbars 14 and 14, the electrode finger 17 extending from the one busbar 14 and the electrode finger 17 extending from the other busbar 14 are formed into a comb shape so as to intersect with one another. In this example, the number of the electrode fingers 17 at the input side IDT electrode 12 is, for example, 150.

Here, apodized weighting is performed on the respective electrode fingers 17 at the input side IDT electrode 12. That is, assume that a dimension at which the electrode fingers 17 and 17 adjacent to one another intersect is referred to as an intersection length D. Then, the respective electrode fingers 17 are disposed so that the intersection length D continuously changes along the propagation direction of the elastic wave. Specifically, the electrode finger 17 extending from the busbar 14 at a far-side at a left end of the input side IDT electrode 12 is disposed opposed to a distal end portion of an auxiliary electrode finger 18 extending from the busbar 14 at a near-side toward the far-side.

Another electrode finger 17 adjacent to the left-end electrode finger 17 from the right side extends from the busbar 14 at the near-side toward the far-side, and is disposed so as to be opposed to the distal end portion of the auxiliary electrode finger 18 extending from the busbar 14 at the far-side toward the near-side. Therefore, assume that a dimension between the busbars 14 and 14 is referred to as an aperture W. The above-described intersection length D is shorter than the aperture W by the length dimension of the auxiliary electrode finger 18 at the two electrode fingers 17 and 17 at the left end of the input side IDT electrode 12.

The length dimension of the third auxiliary electrode finger 18 from the left end is shorter than the length dimension of the second auxiliary electrode finger 18 from the left end of the input side IDT electrode 12. Accordingly, the length dimension of the electrode finger 17 with respect to the auxiliary electrode finger 18 is longer than the left-side electrode finger 17. Thus, at the input side IDT electrode 12, the length dimension of the auxiliary electrode finger 18 becomes shorter as approaching from the left end to the center side. Accordingly, the intersection length D becomes longer as approaching the center side.

The intersection length D is the same as the aperture W or almost same as the aperture W at an approximate center portion of the input side IDT electrode 12 in the propagation direction of the elastic wave. Therefore, assume that the approximate center portion is referred to as "a maximum intersection width region 10." At this maximum intersection width region 10, the apodized weighting is configured to be, so to say, a zero. In other words, the auxiliary electrode finger 18 is not disposed (the length dimension of the auxiliary electrode finger 18 is set to zero). In this example, "the maximum intersection width region 10" is a line passing through the center position of the left-side electrode finger 17 among the two electrode fingers 17 and 17 at which the intersection length D becomes the largest at the input side IDT electrode 12. Assuming a wavelength of the elastic wave propagating on the input side IDT electrode 12 is expressed as "λ", the intersection length D at the maximum intersection width region 10 is 12.5λ.

On the other hand, the length dimension of the auxiliary electrode finger 18 gradually lengthens as approaching toward the right end of the input side IDT electrode 12 at the right side with respect to the maximum intersection width region 10 (position close to the output side IDT electrode 13). Accordingly, the intersection length D decreases as approaching toward the right end. To say differently on the above-described apodized weighting, the intersection length D gradually decreases from the approximate center portion (the maximum intersection width region 10) toward both sides in the propagation direction of the elastic wave. Even at both right and left end portions of the input side IDT electrode 12, the intersection length D does not reach zero. That is, the input side IDT electrode 12 is weighted only with the apodized main lobe. Like general transversal filters, the input side IDT electrode 12 is not weighted with side lobes, which are found together with the main lobe.

The above-described maximum intersection width region 10 is shifted rightward (the output side IDT electrode 13 side) with respect to a center position 1 of the input side IDT electrode 12 in the propagation direction of the elastic wave. A separation distance between the maximum intersection width region 10 and the center position 1 is 12.5% of the length dimension of the input side IDT electrode 12 in the propagation direction of the elastic wave. Thus, the reason for shifting the maximum intersection width region 10 from the center position 1 will be described in detail later.

The output side IDT electrode 13 is configured similarly to the input side IDT electrode 12. Specifically, the output side IDT electrode 13 includes the pair of busbars 14 and 14 and a plurality of the electrode fingers 17. A plurality of the electrode fingers 17 alternately extend from these busbars 14 and 14 toward the opposed busbars 14 and 14 into a comb shape. Regarding the output side IDT electrode 13 as well, the respective electrode fingers 17 are weighted with the apodized main lobe. The maximum intersection width region 10 at the output side IDT electrode 13 is set to a position shifted rightward with respect to the center position 1 of the output side IDT electrode 13 in the propagation direction of the elastic wave.

A shift amount of the maximum intersection width region 10 from the center position 1 at the output side IDT electrode 13 is the same dimension as the shift amount of the maximum intersection width region 10 from the center position 1 at the input side IDT electrode 12. Therefore, it can be said that the output side IDT electrode 13 applies the configuration where the input side IDT electrode 12 is arranged to the right side as it is as the output side IDT electrode 13.

The reflector 31 includes a pair of reflector busbars 32 and 32 and a plurality of reflector electrode fingers 33. The reflector busbars 32 and 32 each extends along the propagation direction of the elastic wave. The reflector busbars 32 and 32 are disposed so as to be in parallel, separating from one another in the direction perpendicular to the propagation direction. The respective reflector electrode fingers 33 expand in the direction perpendicular to the propagation direction of the elastic wave so as to mutually connect these reflector busbars 32 and 32. In this example, the number of reflector electrode fingers 33 of the respective reflectors 31 is, for example, 50.

When an electrical signal is input from the input port 21, the elastic wave is resonated in a longitudinal mode between the reflectors 31 and 31, and the electrical signal is taken out from the above-described filter via an output port 22. Accordingly, a band-pass filter that includes a passband and stopbands is formed. The stopbands are formed at respective low-pass side and high-pass side with respect to the passband.

Here, the following description describes the apodized weighting method at the above-described respective IDT electrodes 12 and 13, that is, a reason for shifting the maximum intersection width regions 10 from the center positions 1 of the respective IDT electrodes 12 and 13 in detail.

Figure 2:
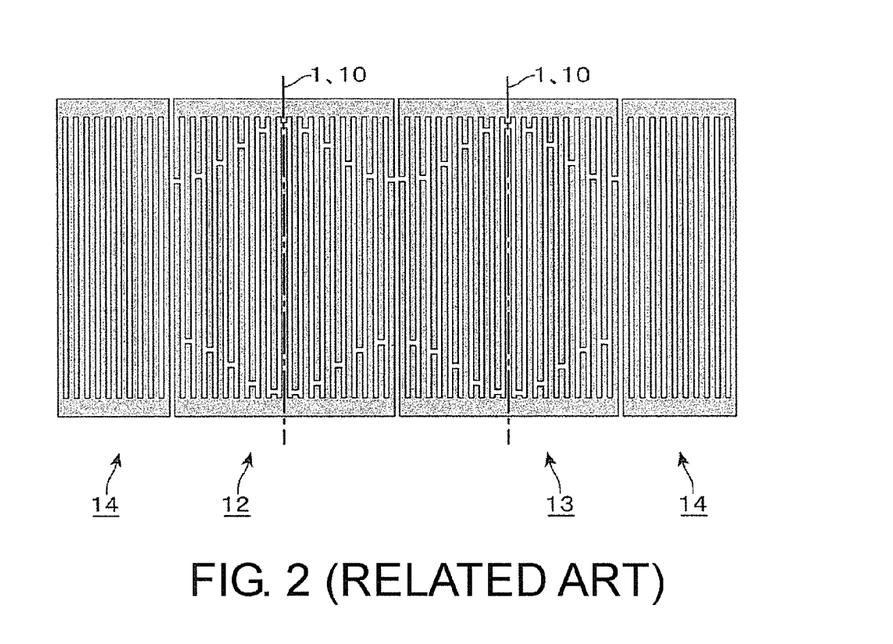
FIG. 2 is a plan view illustrating a configuration in the case where a resonant filter of the related art is weighted.

In the case where the apodized weighting is performed on the IDT electrodes 12 and 13 of the resonant filter, typically, a method of superimposing the maximum intersection width region 10 and the center position 1 with one another is applied. That is, with the resonant filter, since the elastic wave resonates between the reflectors 31 and 31, the IDT electrodes 12 and 13 are constituted so as to be symmetrical as much as possible seen from the respective reflectors 31 and 31. Specifically, when the arrangement of the electrode fingers 17 is the same both when the IDT electrodes 12 and 13 are viewed from the one reflector 31 and from the other reflector 31 among the pair of reflectors 31 and 31, the resonance of elastic wave occurs properly (so that attenuation is reduced). FIG. 2 illustrates an exemplary configuration assuming that the apodized weighting is performed on the configuration with the IDT electrodes 12 and 13 and the reflectors 31 and 31 by the related art method.

To perform the apodized weighting on the respective IDT electrodes 12 and 13, for example, the following expression is employed.

Weighting amount=$A+(1-A)\cos((k(x) \times \pi))$

As described later, $k(x)$ is a weighting function employed for weighting. "A" is a constant.

Figure 3:
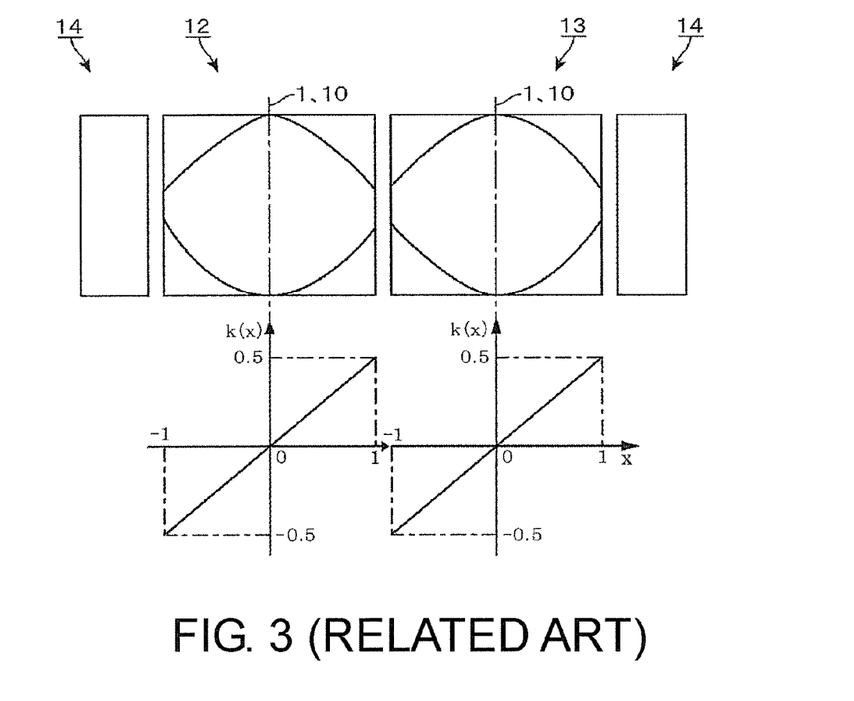
FIG. 3 is a schematic view illustrating an exemplary weighting method for the related art elastic wave filter.

That is, focusing on the input side IDT electrode 12, as illustrated at the lower drawing in FIG. 3 of the related art, a coordinate of the center position 1 at the input side IDT electrode 12 is set to zero (origin), and the positive side and the negative side of the x-axis are imaginarily set to the right direction and the left direction from the center position 1, respectively. The x coordinates at a left end position and a right end position at the input side IDT electrode 12 are set to "−1" and "1", respectively and (0.5×x) is employed as the weighting function $k(x)$. In this case, values of the weighting function $k(x)$ at the left end position and the right end position become "−0.5" and "0.5", respectively. Therefore, the weighting function $k(x)$ linearly changes across the left end to the right end at the input side IDT electrode 12.

Thus, when respective specific values of the weighting function $k(x)$ at the x coordinate are substituted to the above-described expression, the weighting amounts at the respective coordinate positions (intersection lengths D) are calculated and the weighting as illustrated in the upper drawing in FIG. 3 is performed. As apparent from the upper drawing and the lower drawing in FIG. 3, the x coordinate at which the weighting function $k(x)$ is zero is the center position 1 at the input side IDT electrode 12. The upper drawing in FIG. 3 schematically draws parts at which the electrode finger 17 and the auxiliary electrode fingers 18 positioning at the far side or the near side with respect to the electrode finger 17 are opposed as curved lines. The same applies to FIG. 5 or a similar drawing, which will be described later.

Figure 4:
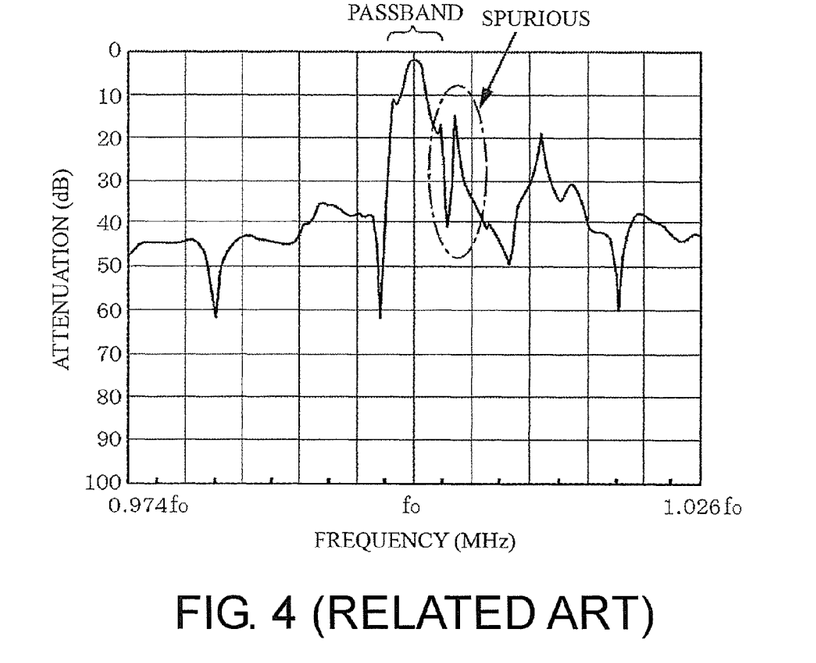
FIG. 4 is a characteristic view illustrating characteristics obtained with the related art elastic wave filter.
Figure 6:
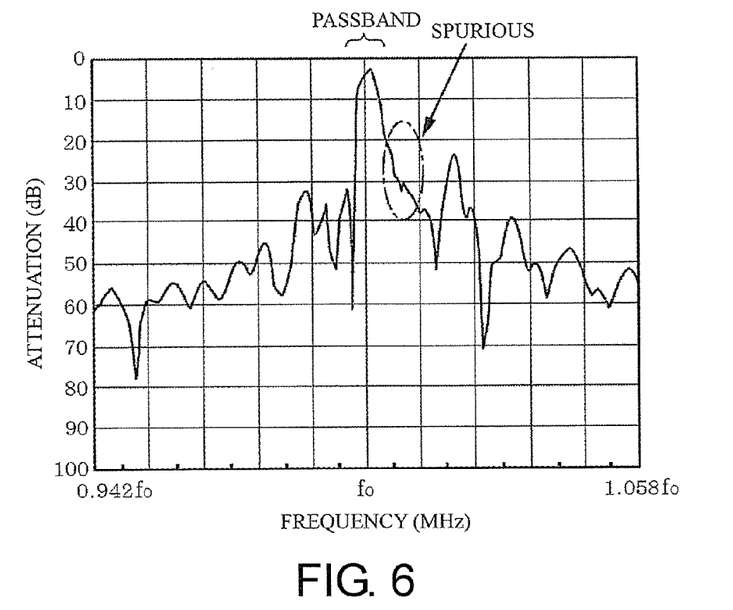
FIG. 6 is a characteristic view illustrating characteristics obtained with the elastic wave filter of this disclosure.

When the output side IDT electrode 13 is also weighed using the similar weighting function $k(x)$, as illustrated in the upper drawing and the lower drawing of FIG. 3, the layouts of the electrode fingers 17 and 18 are set. A filter was actually fabricated using such weighting method, and frequency characteristics were evaluated. Then, the result illustrated in FIG. 4 of the related art was obtained. That is, at the high-pass side with respect to the passband, extremely large spurious occurred. Accordingly, it is found that good attenuation cannot be obtained at the stopband at the high-pass side for use as a band pass filter. The fabricated filter used a crystal as the piezoelectric substrate 11. The total number of the electrode fingers 17 of the respective IDT electrodes 12 and 13 and the total number of the reflector electrode fingers 33 of the respective reflectors 31 were configured to 210 and 100, respectively. The intersection length D at the maximum intersection width region 10 was set to 20λ. FIG. 4 uses values specified at a center frequency f0 in a passband of the filter as a horizontal axis. The same applies to FIG. 6 and FIG. 15, which will be described later.

Figure 5:
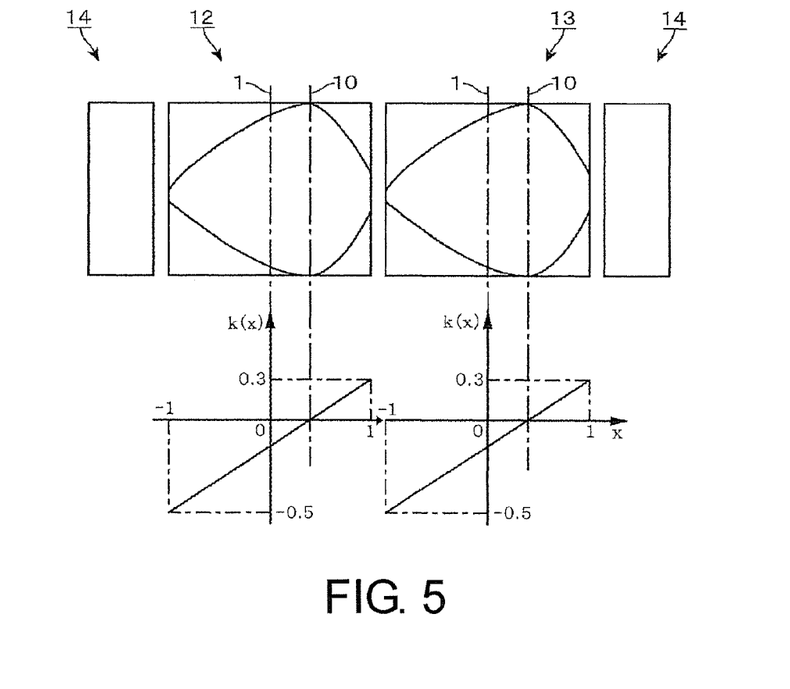
FIG. 5 is a schematic view illustrating an exemplary weighting method for an elastic wave filter of this disclosure.

On the other hand, regarding the weighting method illustrated in the above-described FIG. 1, setting the weighting function $k(x)$ to (0.4×x−0.1) distributes the weighting function $k(x)$ as illustrated in FIG. 5. That is, at the left ends of the respective IDT electrodes 12 and 13, the weighting function $k(x)$ becomes "−0.5" while at the right ends of the respective IDT electrodes 12 and 13, the weighting function $k(x)$ becomes "0.3." Therefore, the weighting function $k(x)$ intersects with the x-axis at the x coordinate of "0.25". "In other words, at the position of "0.25" of the x coordinate, the weighting becomes zero (the intersection length D becomes the maximum). Accordingly, when calculating a ratio of the 0.25 to the dimension from the left end to the right end of the input side IDT electrode 12 in the x direction (=2), it is found out to be 12.5%. It can be said that at the input side IDT electrode 12 of the above-described FIG. 1, the maximum intersection width region 10 is shifted from the center position 1 by 12.5% of the length dimension of the input side IDT electrode 12 in the x direction.

When the layouts of the electrode fingers 17 and 18 are set using the similar weighting function k(x) for the output side IDT electrode 13 as well, the maximum intersection width region 10 shifts rightward from the center position 1 by 12.5% of the length dimension of the output side IDT electrode 13 in the x direction.

The above-described filter of FIG. 1 according to the disclosure was actually fabricated and frequency characteristics were evaluated. Then, the result illustrated in FIG. 6 was obtained. As apparent from the comparison between FIG. 6 and the above-described FIG. 4, this disclosure restricts a spurious at the high-pass side with respect to the passband to extremely small compared with FIG. 4.

Here, the following description describes the reason for setting the weighting function k(x) as described above. That is, the weighting function k(x) at the input side IDT electrode 12 and the weighting function k(x) at the output side IDT electrode 13 were variously changed like the following table. Then, how the frequency characteristics of the filter were changed was simulated.

TABLE

Figure 7:
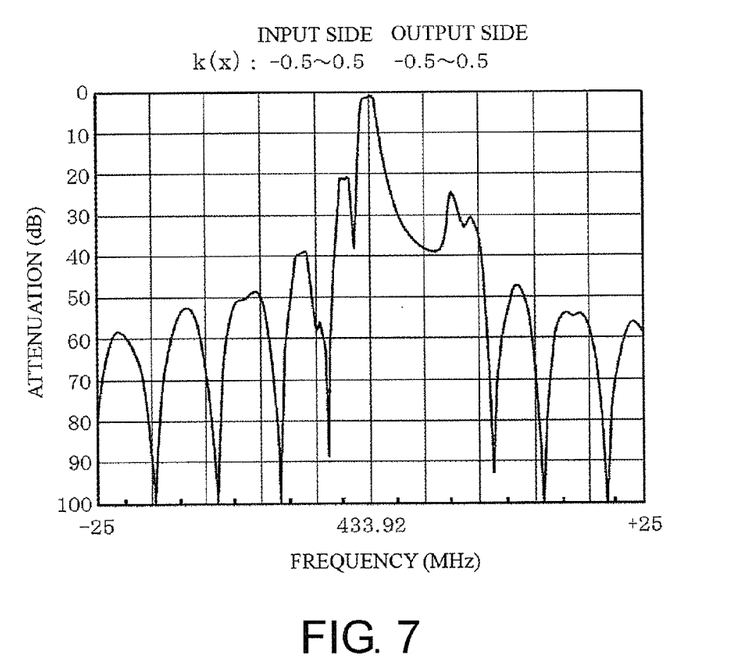
FIG. 7 is a characteristic view illustrating a result of simulation conducted in this disclosure.
Figure 8:
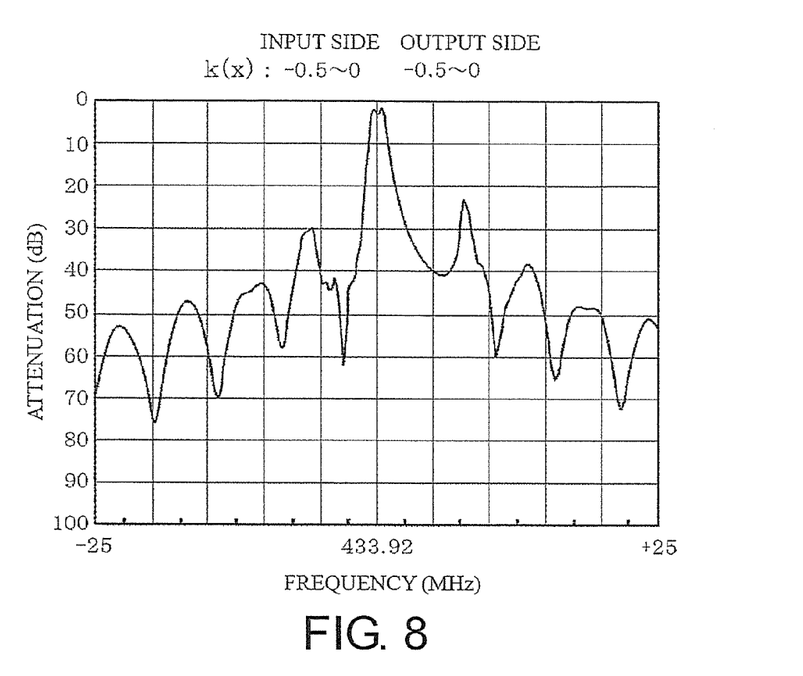
FIG. 8 is a characteristic view illustrating a result of simulation conducted in this disclosure.
Figure 9:
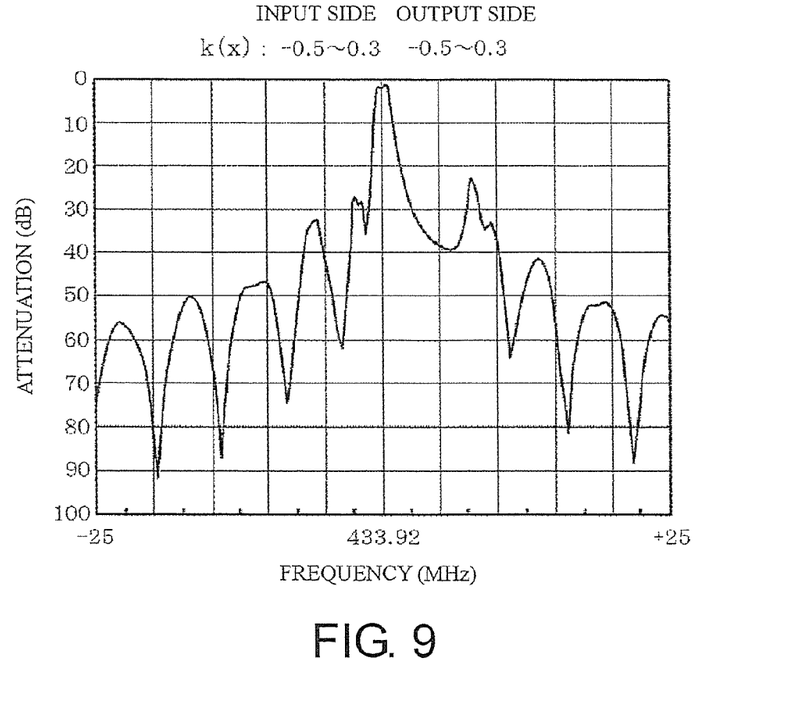
FIG. 9 is a characteristic view illustrating a result of simulation conducted in this disclosure.
Figure 10:
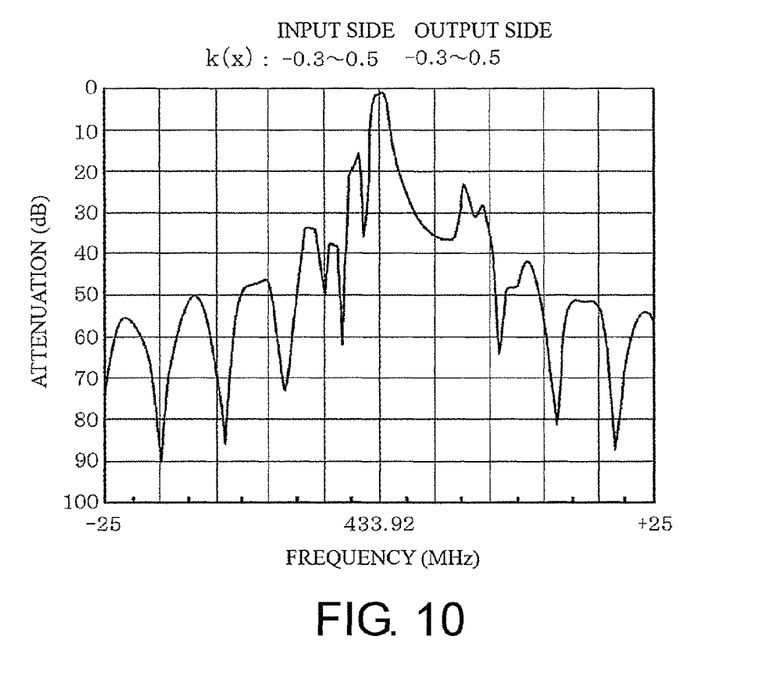
FIG. 10 is a characteristic view illustrating a result of simulation conducted in this disclosure.
Figure 11:
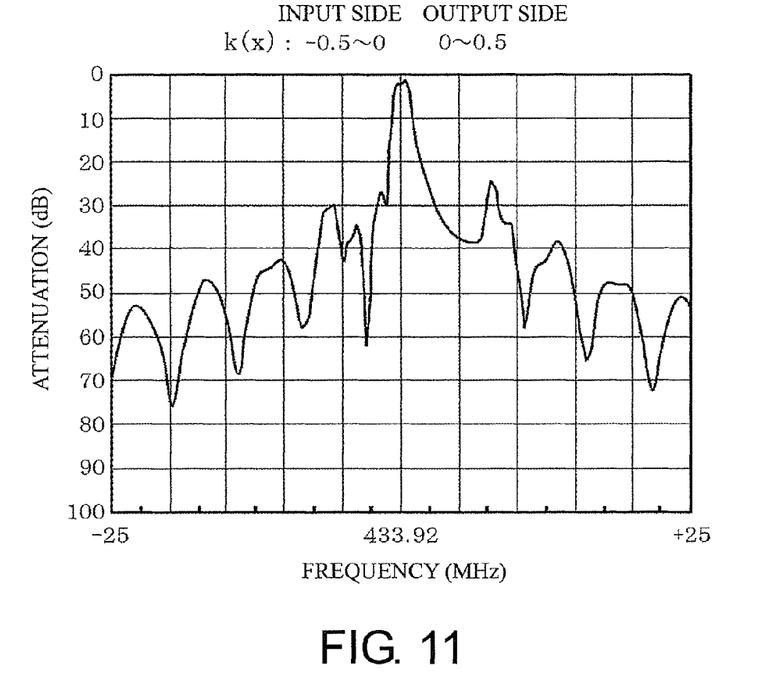
FIG. 11 is a characteristic view illustrating a result of simulation conducted in this disclosure.
Figure 12:
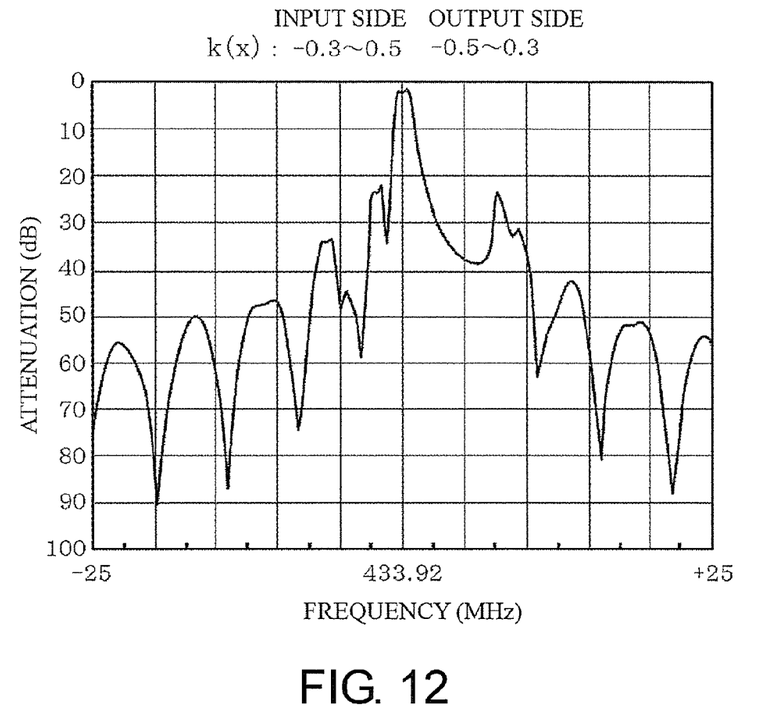
FIG. 12 is a characteristic view illustrating a result of simulation conducted in this disclosure.

|  | Input side IDT electrode | Output side IDT electrode |
| --- | --- | --- |
| FIG. 7 | −0.5 to 0.5 | −0.5 to 0.5 |
| FIG. 8 | −0.5 to 0 | −0.5 to 0 |
| FIG. 9 | −0.5 to 0.3 | −0.5 to 0.3 |
| FIG. 10 | −0.3 to 0.5 | −0.3 to 0.5 |
| FIG. 11 | −0.5 to 0 | 0 to 0.5 |
| FIG. 12 | −0.3 to 0.5 | −0.5 to 0.3 |

The description in this table will be described using items of FIG. 7 as an example, for example. "−0.5 to 0.5" means that the weighting function k(x) is set so that the value of the weighting function k(x) becomes "−0.5" at the left end of the IDT electrode 12 (13) while the value of the weighting function k(x) becomes "0.5" at the right end of the IDT electrode 12 (13). Between the left end and the right end, the weighting function k(x) is linearly (the weighting function k(x) becomes a linear function) changed.

As a result, as illustrated in FIG. 7 to FIG. 12, the frequency characteristics were variously changed under respective conditions. Specifically, as illustrated in FIG. 7, compared with the frequency characteristics in the case where the maximum intersection width region 10 and the center position 1 were mutually superimposed (FIG. 2 and FIG. 3), in FIG. 8, a peak at the low-pass side with respect to the passband was significantly reduced. In FIG. 9 (the example of FIG. 1), the peak at the low-pass side with respect to the passband has a magnitude of between FIG. 7 and FIG. 8. In FIG. 10, the peak at the low-pass side is increased more than the peak of FIG. 7. In FIG. 11 and FIG. 12 as well, a peak strength at the low-pass side with respect to the passband becomes a magnitude different from one in FIG. 7.

From the above-described simulation results, it is seen that the frequency characteristics of the respective examples of FIG. 7 to FIG. 12 differed from one another. On the other hand, a spurious did not appear at a neighborhood of the passband by the simulation. Therefore, with this disclosure, filters were actually fabricated and characteristics were evaluated on the respective examples of FIG. 7 (FIG. 2) and FIG. 9 (FIG. 1) among the above-described FIG. 7 to FIG. 12. Then, the results illustrated in the above-described FIG. 4 and FIG. 6 were obtained. That is, this disclosure preliminary grasped that the frequency characteristics were changed by various simulations, and then actually fabricated the filters for evaluation for spurious. To conduct the simulation, shifting the maximum intersection width region 10 from the center position 1 is not an aspect employed for usual resonant filters. Therefore, it can be said that this disclosure is a technique significantly different from the conventional techniques in that the simulation on the aspect that would not be applied usually was conducted and the filters were actually fabricated and the characteristics were evaluated based on the simulation result.

According to the above-described embodiment, the respective IDT electrodes 12 and 13 of the resonant filters using the longitudinal mode are weighted with the apodized main lobe and the maximum intersection width region 10 and the center position 1 are shifted. At these IDT electrodes 12 and 13, the maximum intersection width regions 10 are shifted in the same direction (right side) with respect to the respective center positions 1. Additionally, the shift amounts between the respective center positions 1 and the maximum intersection width regions 10 are the same. Accordingly, as details are described above, a spurious that occurs at the high-pass side with respect to the passband can be reduced.

Figure 13:
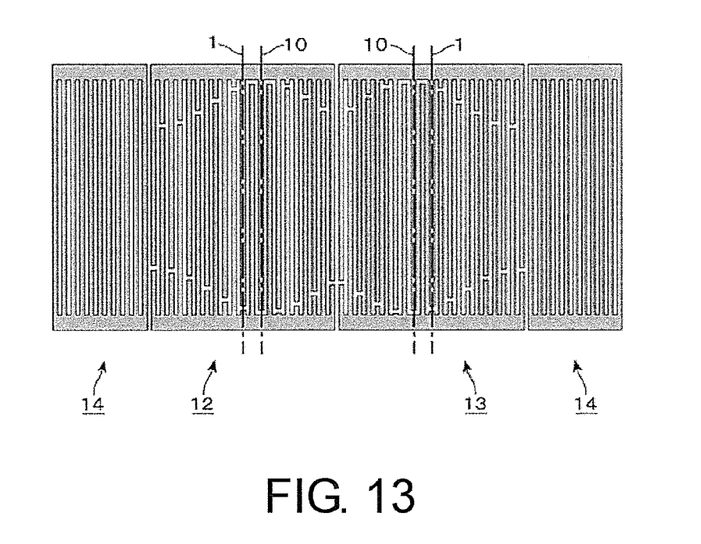
FIG. 13 is a plan view illustrating another exemplary elastic wave filter of this disclosure.

Next, the following description lists other examples of this disclosure. FIG. 13 is an example illustrating the input side IDT electrode 12 with the same configuration as the configuration of the above-described FIG. 1 and the output side IDT electrode 13 with the maximum intersection width region 10 shifted to leftward with respect to the center position 1 (the input side IDT electrode 12 side). A separation distance between the maximum intersection width region 10 and the center position 1 is the same dimension among the IDT electrodes 12 and 13. That is, among the IDT electrodes 12 and 13, in the case where an imaginary line extending in a direction perpendicular to the propagation direction of the elastic wave is drawn, the output side IDT electrode 13 is symmetrical to the input side IDT electrode 12 via the imaginary line.

Figure 14:
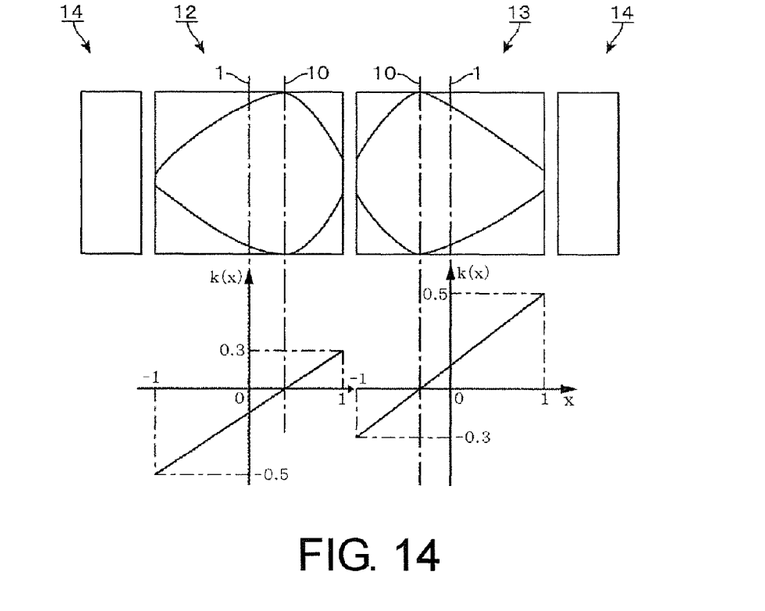
FIG. 14 is a schematic view illustrating an exemplary weighting method for the elastic wave filter of this disclosure.
Figure 15:
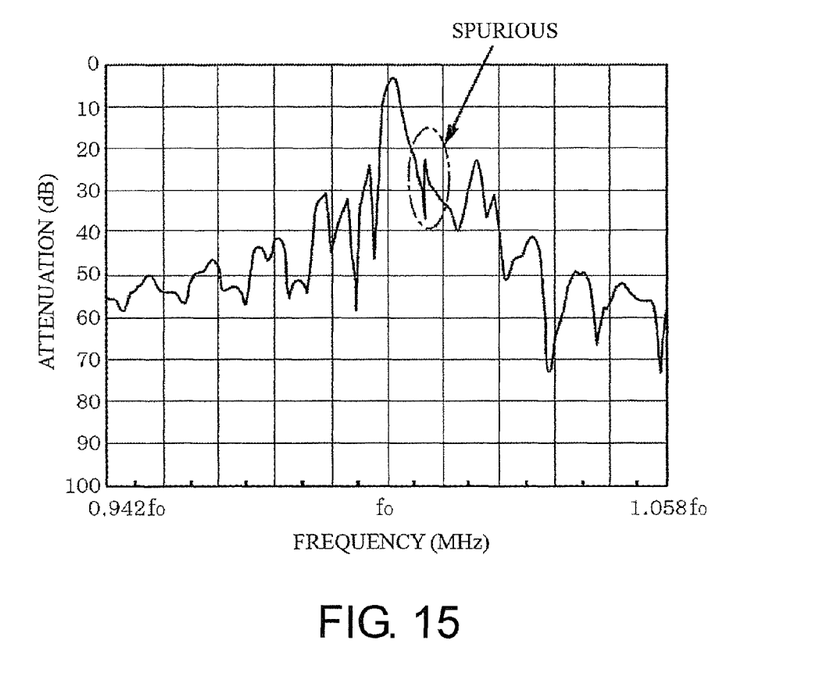
FIG. 15 is a characteristic view illustrating characteristics obtained with the elastic wave filter of this disclosure.

To thus perform the weighting, as illustrated in FIG. 14, the weighting function k(x) is set so that the value of weighting function k(x) becomes, for example, "−0.3" at the left end of the output side IDT electrode 13 while the value of weighting function k(x) becomes "0.5" at the right end of the output side IDT electrode 13. The filter on which the weighting was thus performed was actually fabricated and frequency characteristics were evaluated. Then, as illustrated in FIG. 15, compared with the above-described FIG. 4, a spurious at the high-pass side with respect to the passband was improved.

Figure 16:
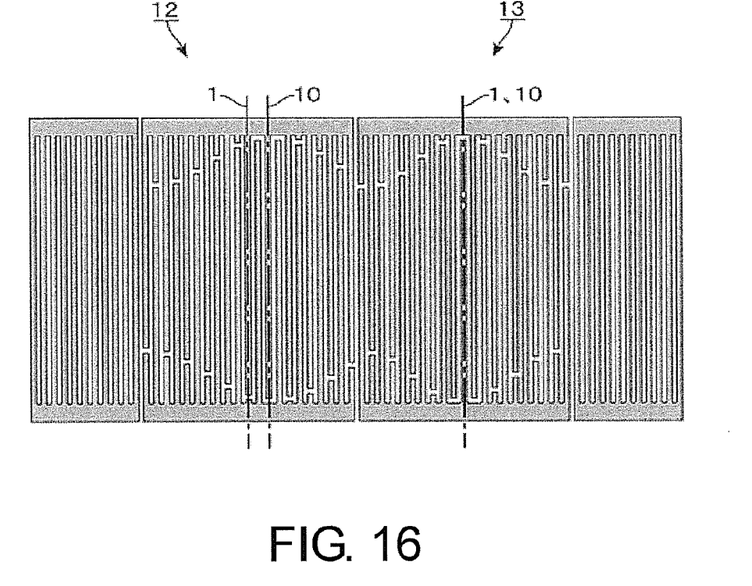
FIG. 16 is a plan view illustrating yet another exemplary elastic wave filter of this disclosure.
Figure 17:
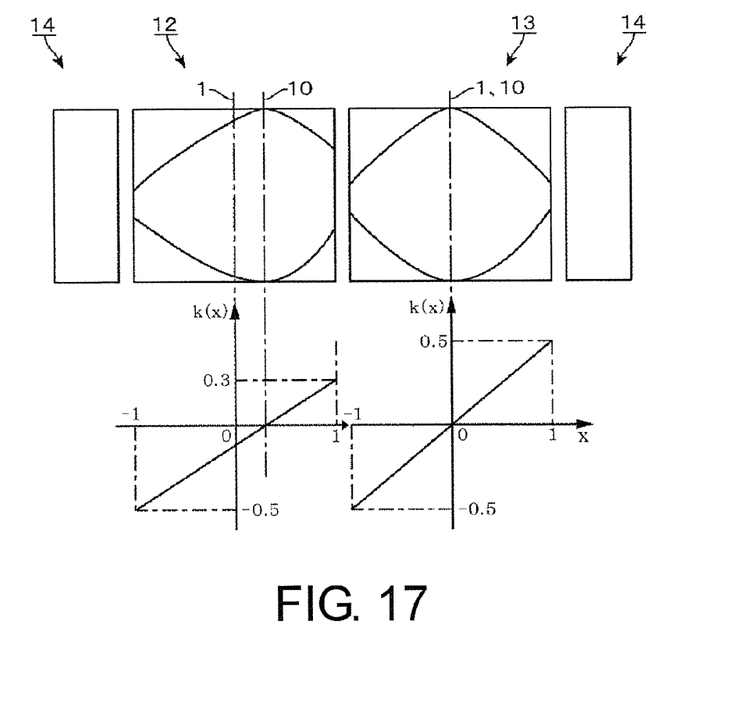
FIG. 17 is a schematic view illustrating an exemplary weighting method for the elastic wave filter of this disclosure.

As illustrated in FIG. 16, the configuration of, for example, FIG. 1 may be employed for the input side IDT electrode 12 and the configuration of FIG. 2 may be employed for the output side IDT electrode 13. That is, in FIG. 16, the maximum intersection width region 10 at the input side IDT electrode 12 is shifted from the center position 1 while the maximum intersection width region 10 and the center position 1 at the output side IDT electrode 13 are mutually superimposed. FIG. 17 illustrates such weighting method. It can be seen that FIG. 17 illustrates the method of combination of a design method of the input side IDT electrode 12 in FIG. 1 and a design method of the output side IDT electrode 13 in FIG. 2.

Figure 18:
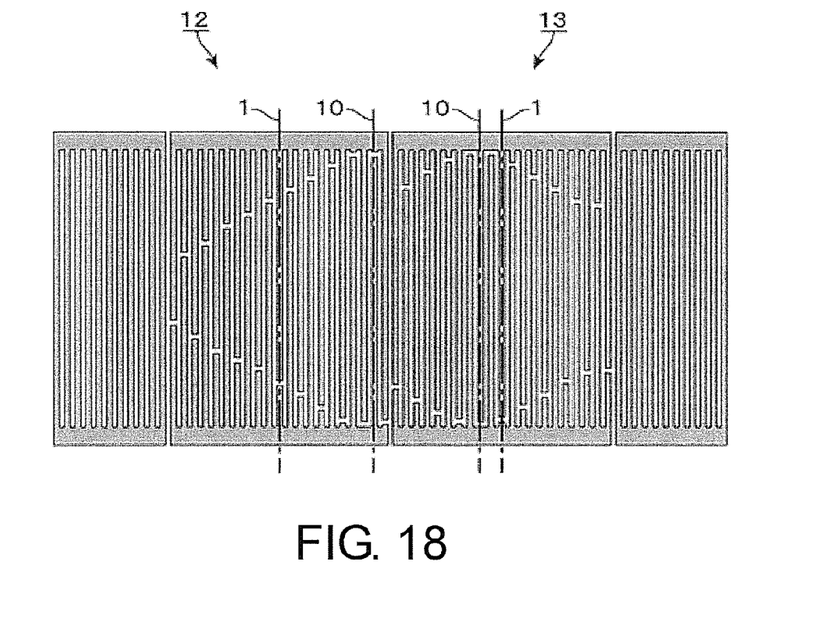
FIG. 18 is a plan view illustrating yet another exemplary elastic wave filter of this disclosure.
Figure 19:
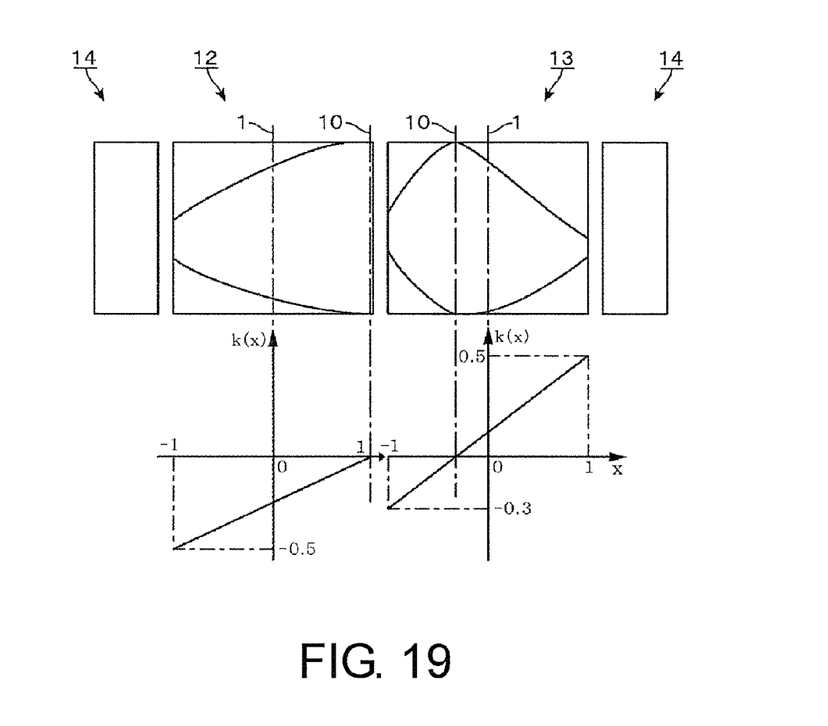
FIG. 19 is a schematic view illustrating an exemplary weighting method for the elastic wave filter of this disclosure.

FIG. 18 illustrates an example where the maximum intersection width region 10 of the input side IDT electrode 12 is set at the end portion of the output side IDT electrode 13 side. That is, as illustrated in FIG. 19, the weighting function k(x) was set as a linear function so that the weighting function k(x) becomes, for example, "−0.5" at the left end of the input side IDT electrode 12 while the weighting function k(x) becomes "0 (zero)" at the right end oft the input side IDT electrode 12. Among the layouts described in the above-described respective examples, the configuration similar to, for example, FIG. 13 is employed for the output side IDT electrode 13.

Figure 20:
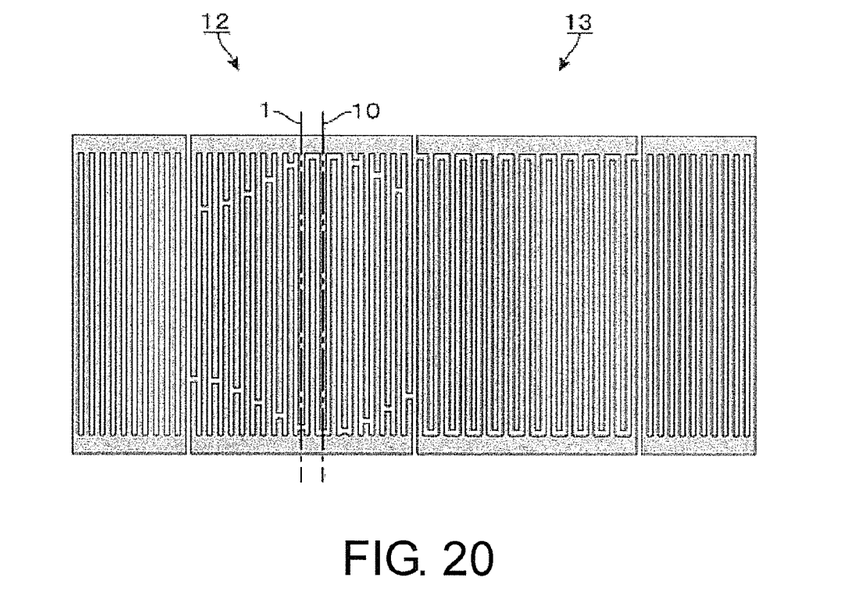
FIG. 20 is a plan view illustrating yet another exemplary elastic wave filter of this disclosure.
Figure 21:
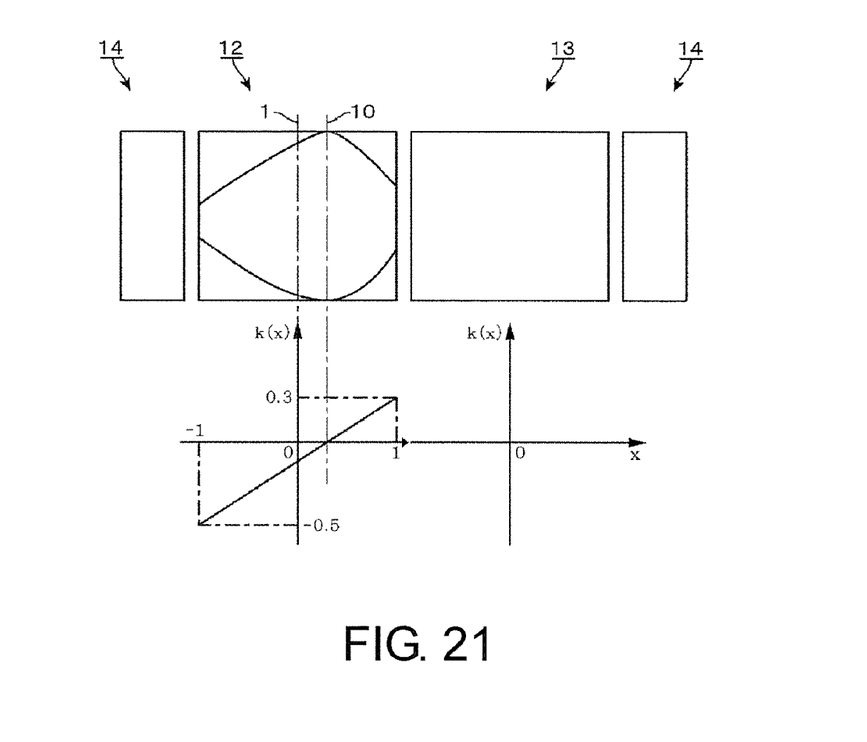
FIG. 21 is a schematic view illustrating an exemplary weighting method for the elastic wave filter of this disclosure.

FIG. 20 illustrates an example of the input side IDT electrode 12 with a similar configuration to the configuration of FIG. 13. On the other hand, the apodized weighting is not performed on the output side IDT electrode 13. The output side IDT electrode 13 is configured as a so-called standard type electrode. That is, as illustrated in FIG. 21, it can be said that the weighting function k(x) of the output side IDT electrode 13 is "0 (zero)" from the left end to the right end.

With the filters of the above-described respective examples, the too large aperture W is likely to generate a spurious. Meanwhile, the too small aperture W is likely to increase impedance. Accordingly, the aperture W is preferable to be 10λ to 25λ. A too narrow fractional bandwidth of passband of of the filter reduces applications as a band-pass filter. Meanwhile, a too large fractional bandwidth makes manufacture of resonant filters difficult. Accordingly, as described above, in the case where a crystal is employed for the piezoelectric substrate 11, the fractional bandwidth is preferable to be 0.05% to 0.5%. The above-described "fractional bandwidth" indicates a proportion (%) expressed by (bandwidth (MHz))÷(center frequency at passband of filter (MHz))×100.

As apparent from the above-described description of the weighting function k (x), the weighting function k (x) may be set as any linear function. Therefore, the separation dimension between the maximum intersection width region 10 and the center position 1 may be any value insofar as the value is in a range of −100% to +100% and except for 0% in addition to, for example, 12.5% of the length dimension of the IDT electrode 12 (13) in the propagation direction of the elastic wave. Further, as apparent from the above-described FIG. 20, instead of performing such weighting on both the input side IDT electrode 12 and the output side IDT electrode 13, the weighting may be performed on at least one of these IDT electrodes 12 and 13.

The part with the largest intersection length at the at least one IDT electrode may be arranged to be shifted from the center position by 12.5% of a length dimension of the at least one IDT electrode in a propagation direction of an elastic wave. The following embodiments is preferred. The input side IDT electrode and the output side IDT electrode are each weighted with an apodized main lobe. When viewed from one reflector among the pair of reflectors, the part with the largest intersection length at the input side IDT electrode is disposed at a position shifted to one side from the center position at the input side IDT electrode in a propagation direction of an elastic wave. When viewed from the one reflector, a part with the largest intersection length at the output side IDT electrode is disposed at a position shifted to the one side from the center position at the output side IDT electrode in a propagation direction of an elastic wave. Alternatively, when viewed from the one reflector, a part with the largest intersection length at the output side IDT electrode is disposed at a position shifted to another side from the center position at the output side IDT electrode in a propagation direction of an elastic wave.

With this disclosure, apodized weighting is performed on an electrode finger of at least one IDT electrode among an input side IDT electrode and an output side IDT electrode in a resonant filter. Additionally, a part with the largest intersection length in the main lobe is formed at a position shifted in a propagation direction of an elastic wave from a center position of the at least one IDT electrode in a propagation direction of an elastic wave. Accordingly, at a high-pass side with respect to a passband, as apparent from an experimental result, which will be described later, a spurious can be reduced.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An elastic wave filter, comprising:
a piezoelectric substrate;
an input side interdigital transducer (IDT) electrode that includes a pair of busbars and an electrode finger, the pair of busbars being arranged so as to be separated from one another in a direction perpendicular to a propagation direction of an elastic wave on the piezoelectric substrate, the electrode finger each extending from each of the pair of busbars toward an opposed busbar in a comb shape;
an output side IDT electrode that includes a pair of busbars and an electrode finger, the pair of busbars being disposed at positions separating in the propagation direction of the elastic wave with respect to the input side IDT electrode, the pair of busbars being arranged so as to be separated from one another in the direction perpendicular to the propagation direction of the elastic wave on the piezoelectric substrate, the electrode finger each extending from each of the pair of busbars toward an opposed busbar in a comb shape; and
a reflector that includes a pair of reflector busbars and a reflector electrode finger, when viewed from a line arrangement of the input side IDT electrode and the output side IDT electrode, the respective pair of reflector busbars being arranged at one side and another side in the propagation direction of the elastic wave, the pair of reflector busbars being disposed so as to be separated from one another in the direction perpendicular to the propagation direction of the elastic wave, the reflector electrode finger connecting between the reflector busbars, wherein:
assuming that a length dimension at which the electrode fingers adjacent to one another intersect is referred to as an intersection length, at least one IDT electrode among the input side IDT electrode and the output side IDT electrode is weighted only with a main lobe among an apodized weighting method, such that the intersection length becomes short from a part at which one electrode finger is opposed to another electrode finger adjacent to the one electrode finger toward an end portion of the at least one IDT electrode in the propagation direction of the elastic wave, and a part with the largest intersection length in the at least one IDT electrode is shifted to any one of one side and another side in the propagation direction of the elastic wave from a center position at the at least one IDT electrode in the propagation direction of the elastic wave, wherein the input side IDT electrode and the output side IDT electrode are each weighted with the apodized main lobe, when viewed from one reflector among the pair of reflectors, the part with the largest intersection length at the input side IDT electrode is disposed at a position shifted to one side from the center position at the input side IDT electrode in the propagation direction of the elastic wave, and when viewed from the one reflector, the part with the largest intersection length at the output side IDT electrode is disposed at a position shifted to the one side from the center position at the output side IDT electrode in the propagation direction of the elastic wave.

2. The elastic wave filter according to claim 1, wherein the part with the largest intersection length in the at least one IDT electrode is arranged to be shifted from the center position by 12.5% of a length dimension of the at least one IDT electrode in the propagation direction of the elastic wave.

* * * * *